(12) United States Patent
Fischer-Buhner (10) Patent No.: US 12,088,260 B1
(45) Date of Patent: Sep. 10, 2024

(54) SYSTEM AND A METHOD FOR FEEDBACK COMPRESSION THROUGH SAMPLE COMBINING IN DIGITAL PREDISTORTION

(71) Applicant: Nokia Solutions and Networks Oy, Espoo (FI)

(72) Inventor: Arne Fischer-Buhner, Leuven (BE)

(73) Assignee: Nokia Solutions and Networks Oy, Espoo (FI)

( * ) Notice: Subject to any disclaimer, the term of this patent is extended or adjusted under 35 U.S.C. 154(b) by 0 days.

(21) Appl. No.: 18/591,765

(22) Filed: Feb. 29, 2024

(30) Foreign Application Priority Data

Mar. 1, 2023 (FI) ...................................... 20235247

(51) Int. Cl.
*H03F 1/32* (2006.01)
*H04L 25/49* (2006.01)

(52) U.S. Cl.
CPC ......... *H03F 1/3247* (2013.01); *H03F 1/3229* (2013.01)

(58) Field of Classification Search
CPC ......... H03F 1/3247; H03F 1/3229; H03F 1/26
USPC .................................................. 330/149, 151
See application file for complete search history.

(56) References Cited

U.S. PATENT DOCUMENTS

| 8,634,494 B2 * | 1/2014 | Bai ...................... H03F 1/3294 375/295 |
| 9,935,810 B1 | 4/2018 | Hammler et al. |
| 2014/0161207 A1 | 6/2014 | Teterwak |
| 2020/0119755 A1 | 4/2020 | Mahmood et al. |
| 2022/0190852 A1 | 6/2022 | Summerfield et al. |

FOREIGN PATENT DOCUMENTS

| EP | 2763368 A2 | 8/2014 |
| EP | 2824833 A1 | 1/2015 |
| WO | 2018/164866 A1 | 9/2018 |

OTHER PUBLICATIONS

Finnish Office Action for Finnish U.S. Appl. No. 20/235,247 dated Jan. 23, 2024.
Teng Wang et al., "Under-Sampling Effects and Computational Cost Reduction in RF Power Amplifier Behavior Modeling," Proceedings og the 10th European Microwave Integrated Circuits Conference, 2015, pp. 57-60.

(Continued)

*Primary Examiner* — Hieu P Nguyen
(74) *Attorney, Agent, or Firm* — Harness, Dickey & Pierce, P.L.C.

(57) ABSTRACT

Example embodiments provide a compression technique of feedback samples for digital predistortion. A system (100) may comprise a feedback receiver (116) configured to receive feedback signal of a power amplifier (112) output and determine a set of under-sampled samples based on the feedback signal; a compressing circuitry (130) configured to: obtain the under-sampled samples; and compress the under-sampled samples, wherein two or more consecutive under-sampled samples are combined into one or more single samples based on one or more predetermined parameters; and a model coefficient training circuitry (102) configured to receive the compressed under-sampled samples and determine model coefficients for digital predistortion based on the compressed under-sampled samples. A system and a method are disclosed.

14 Claims, 3 Drawing Sheets

(56) References Cited

OTHER PUBLICATIONS

Teng Wang et al., "Mesh-Selecting for Computational Efficient PA Behavioral Modeling and DPD Linearization," IEEE Microwave and Wireless Components Letters, vol. 31, No. 1, Jan. 2021, pp. 37-40.
Jan Kral et al., "On Feedback Sample Selection Methods Allowing Lightweight Digital Predistorter Adaptation,"IEEE Transactions on Circuits and Systems-l: Regular Papers, vol. 67, No. 6, Jun. 2020, pp. 1976-1988.
Hai Huang et al., "Digital Predistortion Function Synthesis using Undersampled Feedback Signal," IEEE Microwave and Wireless Components Letters, vol. 26, No. 10, Oct. 2016, pp. 855-857.
Fischer-Burner Arne et al.: "Low-Complexity Feedback Data Compression for Closed-Loop Digital Predistortion," 2023 IEEE/MTT-S International Microwave Symposium—IMS 2023, IEEE, Jun. 11, 2023 (Jun. 11, 2023), pp. 795-798, XP034385132.
Search Report for European Application No. 24157437.5 dated Jul. 19, 2024.

* cited by examiner

SYSTEM AND A METHOD FOR FEEDBACK COMPRESSION THROUGH SAMPLE COMBINING IN DIGITAL PREDISTORTION

CROSS-REFERENCE TO RELATED APPLICATIONS

This application claims priority to and the benefit of Finnish Patent Application No. 20235247 filed on Mar. 1, 2023, the entire contents of each of which are incorporated herein by reference.

TECHNICAL FIELD

The present application generally relates to information technology. In particular, some example embodiments of the present application relate to digital predistortion systems, and in more particular, to feedback compression through sample combining for digital predistortion.

BACKGROUND

Power efficient transmission (TX) may be important to any modern wireless communication system. A power amplifier (PA) is one contributor to TX power consumption in the wireless communication systems. The PA suffers from a trade-off between amplification linearity and power efficiency. Hence, efficiency of the PA is limited due to the trade-off. Digital predistortion (DPD), among other techniques, may be applied to mitigate nonlinear as well as dynamic distortion due to amplification, enabling linear transmission at higher power and thus a greater efficiency.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

Example embodiments may enable a simple yet effective compression technique to be used in digital predistortion systems. With the proposed compression technique, model coefficient estimation complexity, sample buffering needs and chip data-rates may be reduced. This may be achieved by the features of the independent claims. Further implementation forms are provided in the dependent claims, the description, and the drawings.

According to a first aspect, a system is provided. The system may comprise a feedback receiver configured to receive feedback signal of a power amplifier output and determine a set of under-sampled samples based on the feedback signal; a compressing circuitry configured to obtain the under-sampled samples; and compress the under-sampled samples, wherein two or more consecutive under-sampled samples are combined into one or more single compressed samples based on one or more predetermined parameters; and a model coefficient training circuitry configured to receive the compressed samples and determine model coefficients for digital predistortion based on the compressed samples.

According to an example embodiment of the first aspect, the system may comprise a closed-loop digital predistortion system.

According to an example embodiment of the first aspect, the feedback receiver may comprise one or more analog-to-digital converters configured to perform the under-sampling according to a predetermined under-sampling rate.

According to an example embodiment of the first aspect, the under-sampled samples may comprise under-sampled feedback samples of the feedback signal or an under-sampled error signal indicating differences between a set of the feedback samples and baseband samples of an input of the power amplifier.

According to an example embodiment of the first aspect, the feedback receiver may be configured to determine the under-sampled error signal based on an error signal calculated in an analog domain or determine the under-sampled error signal in a digital domain based on the under-sampled feedback samples and under-sampled baseband samples of the power amplifier input.

According to an example embodiment of the first aspect, the compressing circuitry or the model coefficient training circuitry may be further configured to determine a compressed error signal based on the compressed samples.

According to an example embodiment of the first aspect, the predetermined parameters may comprise at least one of an integration period, an under-sampling rate of the set of under-sampled samples, or a length of the set of under-sampled samples.

According to an example embodiment of the first aspect, the compressing circuitry may comprise an integrate and dump filter configured to combine the two or more consecutive under-sampled samples according to an integration period.

According to an example embodiment of the first aspect, coefficient training circuitry may be configured to determine a regressor matrix, wherein regressors of the regressor matrix are determined based on baseband samples of an intended transmit signal, and wherein two or more determined consecutive regressors are further combined based on the predetermined parameters to match the compressed samples; and wherein the model coefficient training circuitry is configured to determine the model coefficients based on the resulting regressor matrix and the compressed samples.

According to an example embodiment of the first aspect, the compressing circuitry may be configured to receive the under-sampled samples at a sampling rate of a first frequency and to output the compressed samples at a sampling rate of a second frequency, wherein the second frequency is lower than the first frequency.

According to an example embodiment of the first aspect, the compressing circuitry may be configured to divide consecutive under-sampled samples into groups according to the integration period and a length of the set of under-sampled samples, and to combine the group of under-sampled samples within the integration period into the single sample.

According to an example embodiment of the first aspect, the system may further comprise delay circuitries configured to synchronize the baseband samples inputted to at least two of the regressor matrix, the model coefficient training circuitry, the compressing circuitry or the feedback receiver.

According to an example embodiment of the first aspect, the system may comprise at least one of a base station, user equipment or an optical transmitter.

According to an example embodiment of the first aspect, the system may further comprise a digital predistorter configured to output a predistorted input for the power amplifier based on the model coefficients received from the model coefficient training circuitry.

According to a second aspect, a method is provided. The method may comprise receiving, from a feedback receiver, feedback signal of a power amplifier output; determining, by the feedback receiver, a set of under-sampled samples based on the feedback signal; obtaining, by a compressing circuitry, the under-sampled samples; compressing, by the compressing circuitry, the under-sampled samples, wherein two or more consecutive under-sampled samples are combined into one or more single compressed samples based on one or more predetermined parameters; receiving, by a model coefficient training circuitry, the compressed samples; and determining, by the model coefficient training circuitry, model coefficients for digital predistortion based on the compressed samples.

According to an example embodiment of the second aspect, the method may be implemented in a closed-loop digital predistortion system.

According to an example embodiment of the second aspect, the under-sampling may be performed according to a predetermined under-sampling rate by one or more analog-to-digital converters of the feedback receiver.

According to an example embodiment of the second aspect, the under-sampled samples may comprise under-sampled feedback samples of the feedback signal or an under-sampled error signal indicating differences between a set of the feedback samples and baseband samples of an input of the power amplifier.

According to an example embodiment of the second aspect, the method may comprise determining, by the feedback receiver, the under-sampled error signal based on an error signal calculated in an analog domain or determining the under-sampled error signal in a digital domain based on the under-sampled feedback samples and under-sampled baseband samples of the power amplifier input.

According to an example embodiment of the second aspect, the method may comprise determining, by the compressing circuitry or the model coefficient training circuitry, a compressed error signal based on the compressed samples.

According to an example embodiment of the second aspect, the predetermined parameters may comprise at least one of an integration period, an under-sampling rate of the set of under-sampled samples, or a length of the set of under-sampled samples.

According to an example embodiment of the second aspect, the method may comprise combining, by an integrate and dump filter of the compressing circuitry, the two or more consecutive under-sampled samples according to an integration period.

According to an example embodiment of the second aspect, the method may comprise determining, by the model coefficient training circuitry, a regressor matrix, wherein regressors of the regressor matrix are determined based on baseband samples of an intended transmit signal, and wherein two or more determined consecutive regressors are further combined based on the predetermined parameters to match the compressed samples; and wherein the model coefficients are determined by the model coefficient training circuitry based on the resulting regressor matrix and the compressed samples.

According to an example embodiment of the second aspect, the method may comprise receiving, by the compressing circuitry, the under-sampled samples at a sampling rate of a first frequency and to output the compressed samples at a sampling rate of a second frequency, wherein the second frequency is lower than the first frequency.

According to an example embodiment of the second aspect, the method may comprise dividing, by the compressing circuitry, the consecutive under-sampled samples into groups according to the integration period and a length of the set of under-sampled samples, and combining, by the compressing circuitry, the group of under-sampled samples within the integration period into the single sample.

According to an example embodiment of the second aspect, the method may comprise synchronizing, by delay circuitries, the baseband samples inputted to at least two of the regressor matrix, the model coefficient training circuitry, the compressing circuitry or the feedback receiver.

According to an example embodiment of the second aspect, the method may be implemented in at least one of a base station, user equipment or an optical transmitter.

According to an example embodiment of the second aspect, the method may comprise outputting, by a digital predistorter, a predistorted input for the power amplifier based on the model coefficients received from the model coefficient training circuitry.

According to a third aspect, a system may comprise means for receiving feedback signal of a power amplifier output; means for determining a set of under-sampled samples based on the feedback signal; means for obtaining the under-sampled samples; means for compressing the under-sampled samples, wherein two or more consecutive under-sampled samples are combined into one or more single compressed samples based on one or more predetermined parameters; means for receiving the compressed samples; and means for determining model coefficients for digital predistortion based on the compressed samples. The system may further comprise means for performing any example embodiment of the method of the second aspect.

Many of the attendant features will be more readily appreciated as they become better understood by reference to the following detailed description considered in connection with the accompanying drawings.

DESCRIPTION OF THE DRAWINGS

The accompanying drawings, which are included to provide a further understanding of the example embodiments and constitute a part of this specification, illustrate example embodiments and together with the description help to explain the example embodiments. In the drawings.

Like references are used to designate like parts in the accompanying drawings.

DETAILED DESCRIPTION

Reference will now be made in detail to example embodiments, examples of which are illustrated in the accompanying drawings. The detailed description provided below in connection with the appended drawings is intended as a description of the present examples and is not intended to represent the only forms in which the present examples may be constructed or utilized. The description sets forth the functions of the example and a possible sequence of operations for constructing and operating the example. However, the same or equivalent functions and sequences may be accomplished by different examples.

As part of an adaptive DPD system, transmitter output may be observed using a dedicated feedback receiver in order to track changes in the PA behavior. The feedback receiver may be also referred to as an observation receiver. The observed signal may be then used in conjunction with an intended transmit signal to update a DPD model suitable to linearize PA.

With an increasing DPD model size and capability, model coefficient estimation becomes more computationally complex and may pose a contribution towards the overall complexity of the DPD system. The complexity is linked with the number of coefficients in the DPD model used, a bit-resolution per sample required for processing, sample buffering and loading, and an amount of feedback samples. For each parameter update the feedback samples may need to be recorded, buffered and processed. The amount of feedback samples may increase with higher bandwidths. For example, to capture information on the nonlinear distortions which may span, for example, five times of their linear bandwidth, the signals may be sampled at a Nyquist rate, e.g., five times of their bandwidth. Hence, a nominal feedback sample-rate may be five times of the signal's linear bandwidth. Therefore, very high sample-rates may be needed especially with a wideband transmission.

The sampling rate may be reduced with under-sampling. Under-sampling may be also called subsampling. Basically, under-sampling may be down-sampling, wherein the feedback samples are sampled at a sampling rate lower than the Nyquist rate, without additional low-pass filtering. Thus, high-frequency components of the received sample or signal may be aliased to a lower-frequency, and, although time-frequency information of the signal may get corrupted, its statistical information are preserved.

Reducing a sampling-rate may reduce the needed feedback length. Under-sampling may also reduce the required amount of feedback samples as the correlation amongst samples gets reduced. The under-sampling may have a positive effect on modeling, but the effect is limited, as the sample set still has a high correlation. Histogram-based sample selection methods may allow to select a minimal representative subset of samples to reduce the computational cost of the estimation. While these approaches may allow model identification using less samples, the approaches require to first analyze a large transmit sequence or capture a longer feedback sequence in order to extract statistical properties of the signals before a condensed sample set may be derived. Hence, in these approaches, a longer sequence may be first needed to be loaded and processed for reduction and parameter estimation. Alternatively, the statistics could be precomputed, which however may render the approaches incompatible with variation of the PA behavior over time as well as changes in the transmit signals.

An objective is to reduce complexity for estimation of model coefficients for digital predistortion by reducing the number of feedback samples. In addition, a need for buffering recorded feedback may be reduced. This may be achieved applying low-complexity compression on the feedback, by first under-sampling the feedback samples and then combining at least some of the under-sampled feedback samples. This enables, that fewer samples at a reduced rate may need to be collected which reduces sample buffering cost. In addition, a lower power consumption of an associated transmission device may be enabled.

An example embodiment may provide a simple, yet effective, compression technique that builds upon the under-sampling approach but adds combining the samples as to further condense the sample set and make identification more robust. In the presence of quantization noise, the proposed compression technique may be as effective as some complex sample selection methods, but with a lower, almost negligible, complexity. The compression technique may lend itself to substantially real-time, throughput-oriented implementation, obviating a need to first extract statistics from a large set of samples which may depend on the bandwidth. Thus, in addition to reducing model estimation complexity, sample buffering needs and chip data-rates may be reduced.

Figure 1:
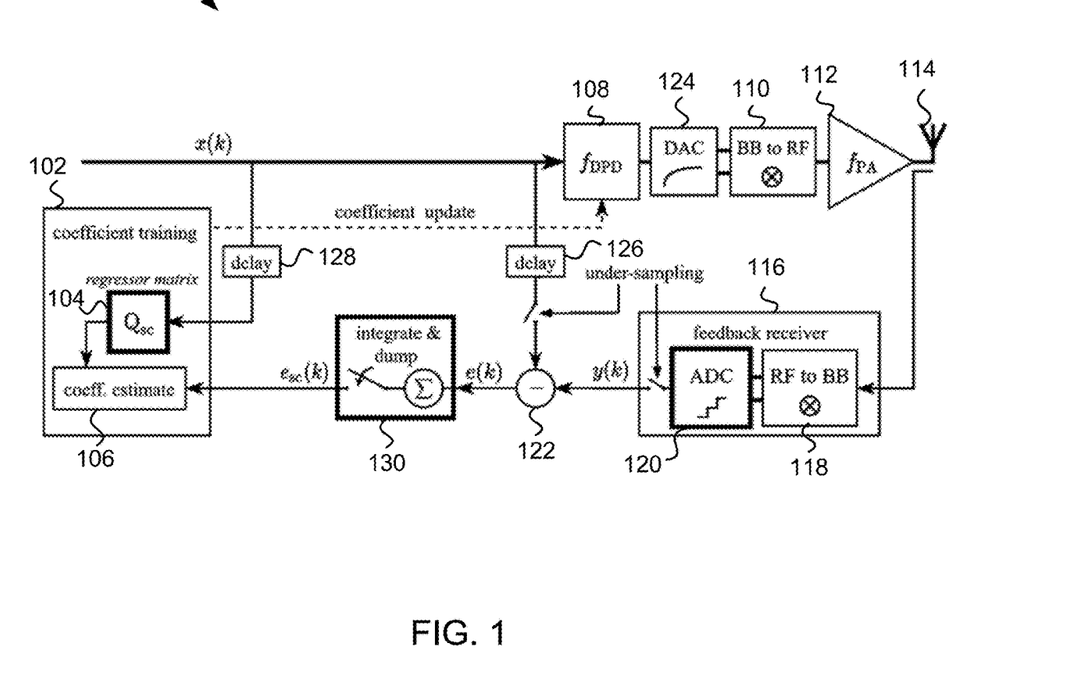
FIG. 1 illustrates an example of a system configured to perform digital predistortion according to an example embodiment.

FIG. 1 illustrates an example of system 100 configured to perform digital predistortion according to an example embodiment. The system 100 may comprise, for example, a closed-loop digital predistortion system. The system 100 may be implemented, for example, in a radio unit. The radio unit may comprise, for example, a wireless or a non-wireless transmitter, such as an optical transmitter. The system 100 may comprise a network node, such as a base station. Alternatively, the system 100 may comprise a client node, which may be also referred to as a user node or user equipment (UE). The system 100 may be configured to mitigate nonlinear distortion of a device comprising, for example, an antenna or an optical transmitter.

The system 100 may comprise a model coefficient training circuitry 102. The model coefficient training circuitry 102 may be configured to determine a regression matrix 104. The model coefficient training circuitry 102 may be configured to obtain samples of a transmit signal as inputs for the regression matrix 104. The inputs may be, for example, complex-valued baseband samples of an intended transmit signal x(k), wherein k denotes the respective sample index. The complex-valued baseband samples x(k) may be sampled at a frequency $f_s$.

The model coefficient training circuitry 102 may further comprise a model coefficient estimate functionality 106. The model coefficient estimate functionality 106 may be configured to obtain an output from the regressor matrix 104 and an error vector $e_{sc}(k)$ as inputs, and to output a model coefficient estimate. The resulting model coefficient estimate may be provided by the model coefficient training circuitry 102 to a digital predistorter 108 as a model coefficient update.

The digital predistorter 108 may be configured to provide a predistorted input $x_{DPD}(k)$ to a PA 112. The system 100 may comprise at least one of the DPD 108 or the PA 112. The DPD 108 may be configured to perform a digital predistortion function $f_{DPD}$, which may be expressed with:

$$x_{DPD}(k) = a^T * q(x(k), x(k-1), \ldots, x(k-M)), \quad (1)$$

assuming any linear-in-parameter model. In the equation (1), q is a vector comprising nonlinear regressors of the model, which may be dependent on the input complex-valued baseband samples x(k) up to a maximum history M. a is a vector comprising complex-valued coefficients, wherein a length of a matches the length of the set of nonlinear regressors in q. $a^T$ is the transpose of the vector a. The predistortion function may be implemented, for example, by means of one or more lookup tables, direct implementation of the operations, or a combination of both.

The predistorted input $x_{DPD}(k)$ may be provided to one or more digital-to-analog converters, DAC 124. The DAC 124 may comprise two DAC paths in order to convert real- and imaginary parts of the input separately into analog signals, which represent I (in-phase) and Q (quadrature phase) parts of the baseband signal. The DAC 124 may be further coupled from output to a I/Q modulator 110, configured to upconvert the two analog signals and then combined to a single analog RF waveform, $x_{RF}(t)$. The output signal from the I/Q modulator 110 may be then provided to the PA 112 configured to provide amplified output signals to be transmitted via one or more antennas 114. The DAC 124, the I/Q modulator 110, and/or the at least one antenna 114 may be comprised in the system 100. The system 100 may be also configured to upconvert and transmit the signals with a different configuration. For example, the system 100 may comprise a purely digital transmitter, an optical transmitter, or the like. The system 100 may comprise, or be coupled to, a power amplifying circuitry, which introduces nonlinear distortion. The system 100 may be configured to model and compensate the nonlinear distortion.

The output signals from the PA 112 may be configured to be measured by a feedback path comprising a feedback receiver 116. The feedback receiver 116 may comprise an I/Q demodulator 118 configured to convert the measured output signals to baseband signals. Output of the I/Q demodulator 118 may be coupled to one or more analog-to-digital converters (ADC) 120 configured to provide complex-valued samples ($y(k)$) of the PA feedback signal to be used by the model coefficient training circuitry 102. The ADC 120 may comprise at least two paths configured to sample the I and Q parts of the input signal separately. The resulting two digital signals may be then combined to the complex-valued signal $y(k)$.

Using an online learning scheme, the model coefficients a may be iteratively adapted by the model coefficient estimate function 106. For example, a damped Gauss-Newton learning rule may be used as the online learning scheme:

$$a_{i+1} = a_i - u(Q_i^H Q_i)^{-1} Q_i^H * e_i, \quad (2)$$

wherein u is a learning rate parameter and $e_1 = y_1 - g * x_1$ is an error vector of length L. An error vector may be also referred to as an error signal. The error signal may indicate an error/difference between a set of intended transmit signals and measured PA output samples $y_1$ in a current iteration i. Further, g may be a desired real-valued gain of the PA 112, DPD 108 and the feedback receiver 116. $Q_i$ may contain the regressors respective to each sample in $e_i$. For example, a regressor with respect to an input sample $x_i(k)$ in the i-th iteration may be defined as $q_i(k) = q_i(x_i(k), x_i(k-1), \ldots, x_i(k-M))$. The regressor matrix $Q_i$ may be defined as:

$$Q_i = \begin{bmatrix} q_i^T(1) \\ q_i^T(2) \\ \ldots \\ q_i^T(L) \end{bmatrix},$$

wherein the indexing may start at 1 and is with respect to a sequence in $e_i$ used during iteration i.

From the equation (2), it may be seen that the temporal relationship of feedback samples in $e_i$ may be of no further relevance for updating the coefficients. Hence, this fact may be exploited for under-sampling the feedback samples, by using only every 8-th sample in $e_i$ and constructing a matching $Q_i$ based on matching samples $x(k)$. $\delta$ may represent an under-sampling rate of the feedback samples. Therefore, the feedback receiver 116 may be configured to perform under-sampling on the received feedback samples. For example, the ADC 120 may be configured to under-sample the received feedback samples. The ADC 120 may be configured to perform the under-sampling at the under-sampling rate $\delta$. Alternatively, the system 100 may be configured to perform the under-sampling in digital domain, after full rate ADC sampling. Further, the system 100 may comprise a circuitry configured to under-sample the baseband samples $x(k)$ at a matching under-sampling rate 8. In an implementation form, the ADC 120 may be configured to receive the error signal, and perform under-sampling on the error signal. The feedback receiver 116 may be configured to determine the error signal based on received feedback signal and baseband samples of the PA input.

Under-sampling may be favorable towards parameter identification. Since consecutive feedback samples may exhibit strong correlation, selecting only distant feedback samples may yield a statistically richer sample set. Consequently, fewer samples may be chosen, which reduces the complexity of the model coefficient update.

As can be seen from the equation (2), any linear operation on the samples in $e_i$ may be permitted, given it can be similarly applied to the respective entries in $Q_i$, and it does not systematically remove relevant information (e.g., using a low-pass type filter).

To further improve the representativeness of a low number of samples in $e_i$, several under-sampled consecutive feedback samples may be combined into a single sample. This may be achieved by accumulating the under-sampled feedback samples, and their respective regression entries in $Q_i$.

The system 100 may comprise a compressing circuitry 130 configured to receive the under-sampled feedback samples for calculation of a compressed error signal, wherein two or more of the received under-sampled feedback samples are combined into one or more compressed samples based on one or more predetermined parameters. Alternatively, the system 100 may be configured to receive an under-sampled error signal determined based on the feedback signal, and compress the under-sampled error signal by combining two or more consecutive under-sampled samples of the error signal into one or more single compressed samples based on the one or more predetermined parameters. In addition, the model coefficient training circuitry 102 may be configured to determine the regression entries of the regressor matrix 104 based on an under-sampling rate of the feedback samples and to combine two or more of the regressors based on the one or more predetermined parameters. The combination operation performed by the coefficient training circuitry 102 may be configured to mirror the combination operation performed by the compressing circuitry 130.

Figure 2:
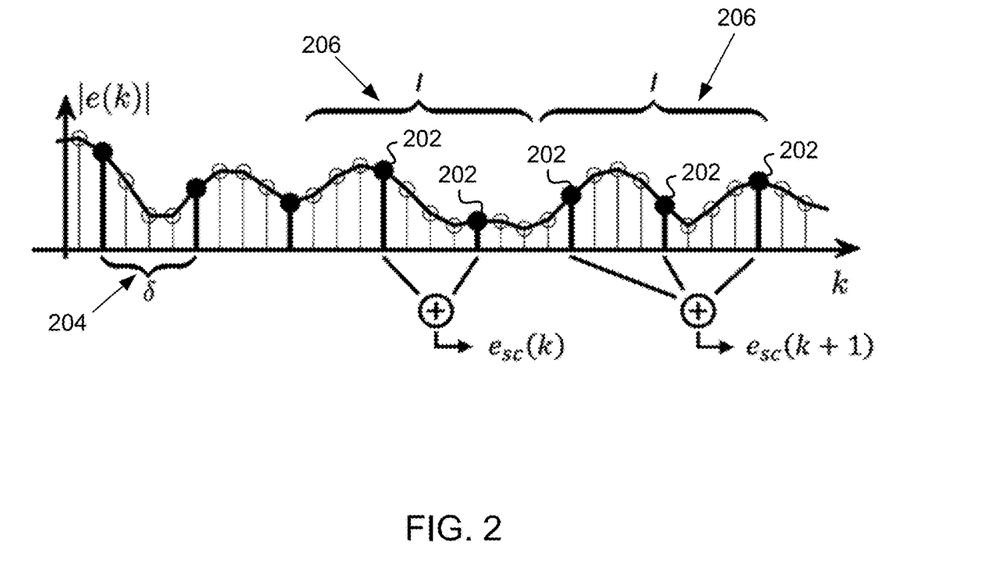
FIG. 2 illustrates an example graph of accumulation of under-sampled feedback samples according to an example embodiment.

For example, the under-sampled feedback samples 202 may be accumulated within an integration period 206 of length I, as illustrated in FIG. 2. The resulting compressed error signal $e_{sc,i}$ and regression matrix $Q_{sc,i}$ respective for the iteration i may be given as:

wherein $\delta$ is the amount of under-sampling, i.e., an under-sampling $$e_{SC,i} = \begin{bmatrix} \sum_{l\delta \in (0,I)} e_i(l\delta) \\ \sum_{l\delta \in (I,2I)} e_i(l\delta) \\ \ldots \\ \sum_{l\delta \in ((L-1)I,LI]} e_i(l\delta) \end{bmatrix} \quad Q_{SC,i} = \begin{bmatrix} \sum_{l\delta \in (0,I)} q_i(l\delta)^T \\ \sum_{l\delta \in (I,2I)} q_i(l\delta)^T \\ \ldots \\ \sum_{l\delta \in ((L-1)I,LI]} q_i(l\delta)^T \end{bmatrix}$$

rate 204, and I is the integration period 206. L is the length of the error signal $e_i$ and number of rows in $Q_i$. The under-sampling rate 204 and the integration period 206 may depend on a sampling rate of the original feedback samples of PA. As shown in an example graph in FIG. 2, the consecutive under-sampled samples 202, sampled at the under-sampling rate 204, may be summed together within the integration period 206 to obtain $e_{sc}(k)$. After that, next consecutive under-sampled samples may be again summed within the integration period to obtain $e_{sc}$ (k+1). The summing operation may be performed repetitively according to the integration period for the set of samples. A summing operation of the consecutive under-sampled feedback samples $y_{sc}(k)$ may be performed in a same manner. The proposed feedback data compression methods may be directly applied to the provided learning rule (equation (2)), modifying $e_i$ to $e_{sc,i}$ and $Q_i$ to $Q_{sc,i}$. In addition, the $e_{sc,i}$ and $Q_{sc,i}$ may be synchronized such that samples in the error sample vector $e_{sc,i}$ match respective rows in $Q_{sc,i}$. For example, the system 100 may comprise one or more delay circuitries 126, 128 configured to synchronize the inputted samples x(k) with PA output. The delay circuitries 126, 128 may be configured to provide the synchronized baseband samples for the regressor matrix 104 and the compressing circuitry 130.

The accumulation of the under-sampled feedback samples, and respectively vector elements in the error signal, may yield a condensed sample set. Combining the under-sampled feedback samples may result in more diverse excitation being incorporated. A loss of information may be largely avoided with the proposed compressing technique due to the high correlation of most feedback samples. Instead, the information for identification may be encoded in a different form, allowing more reliable estimation of model parameters with a reduced sample set size L.

As depicted in FIG. 1, the proposed method may be efficiently implemented with very low additional complexity. In addition to the feedback receiver 116 configured to perform the under-sampling, the system 100 may comprise the compressing circuitry 130 configured to combine two or more consecutive under-sampled feedback or error signal samples into one or more single samples. This may be achieved, for example, by applying a simple integrate and dump operation for additional filtering. For example, the compressing circuitry 130 may comprise an integrate and dump filter. The compressing circuitry 130 may be configured to take an under-sampled sample signal of the ADC 120 and output a condensed signal, error signal $e_{sc}$, at a down-converted rate, such as $f_{sc}=f_s/I$. Complexity of the additional integrate and dump filter is almost negligible as at most ceil (I/δ) additions may be needed to be performed for compressing $e_i$ into $e_{sc,i}$.

Further, the model coefficient training circuitry 102 may be configured to construct regressors q matching the respective under-sampled feedback samples, such that for each under-sampled feedback sample y(k) there is one matching regressor q(k). The model coefficient training circuitry 102 may be configured to combine consecutive regressor entries similarly as the under-sampled feedback samples. For example, the model coefficient training circuitry 102 may be configured to compress the regression matrix 104 based on same parameters as used for compression of the error signal, such as the integration period, under-sampling rate of the feedback samples and a length of the received sample set. The compressed regression matrix 104 may be then provided to the model coefficient estimation function 106 for model coefficient updates together with the compressed error signal.

The system 100 may comprise a comparator circuitry 122. The comparator circuitry 122 may be configured to receive the under-sampled feedback samples and baseband samples of the power amplifier input and to output an under-sampled error signal (e(k)) based on the received sample set (x(k), y(k)). The under-sampled error signal may comprise differences between the received feedback samples and power amplifier input samples. The comparator circuitry 122 may be comprised in the feedback receiver, for example, after the ADC 120 in a digital domain. In an embodiment, the ADC 120 may comprise the comparator circuitry 122. In an embodiment, the comparator circuitry 122 may be configured to receive the feedback signal from the PA 112 output and the baseband samples of the PA 112 input, and to determine an error signal based on the received signals. The comparator circuitry 122 may be then configured to input the error signal to be under-sampled by the ADC 120. In other words, the feedback receiver 116 may be configured to determine an error signal indicating differences between the feedback and input of the PA 112 in an analog domain (before ADC 120) or in a digital domain (after DAC 120). The feedback receiver 116 may be further configured to determine the under-sampled error signal either by under-sampling the error signal or based on the under-sampled feedback sampled received from the ADC 120. In an implementation form, the comparator circuitry 122 may be comprised in the model coefficient training circuitry 102. Hence, the compressing circuitry 130 may be configured to output the compressed under-sampled feedback samples to the model coefficient training circuitry 102, which then determines a compressed version of the error signal based on the compressed under-sampled feedback samples. In an implementation form, the compressing circuitry 130 comprises the comparator circuitry, and determines the compressed error signal based on the under-sampled feedback samples.

For example, the compressing circuitry 130 may be configured to receive the under-sampled error signal. The compressing circuitry 130 may be further configured to divide consecutive vector elements, comprising data based on the consecutive under-sampled feedback samples, of the under-sampled error signal into groups according to the integration period and a length of the under-sampled error signal and combine the group of vector elements within the integration period into a single compressed vector element to output a compressed error signal ($e_{sc}(k)$) with a reduced number of vector elements. The compressed error signal may thus be a compressed version of the under-sampled error signal. These summing operations may be performed, for example, by the integrate and dump filter. The model coefficient training circuitry 102 may be configured to receive the compressed error signal and provide model coefficient estimates to the DPD 108 based on the compressed error signal. Similarly, the model coefficient training circuitry 102 may be configured to determine the regressors respective to the under-sampled error signal, and then to combine two or more consecutive regressors to match the compressed error signal. The resulting compressed regressor matrix 104 may be used in determining the model coefficient estimates with the compressed error signal.

The compressing circuitry 130 may be configured to compress the vector elements of the feedback samples such that only some of the under-sampled samples are combined and some of the under-sampled samples may not be combined. For example, on average 1.5 samples could be combined, and thus, each of the under-sampled samples may not be combined. The consecutive under-sampled samples to be combined may be randomly or systematically selected. Alternatively, the compressing circuitry 130 may be configured to combine all of the under-sampled samples comprised in the received set of under-sampled samples.

Hence, the under-sampled feedback samples may be compressed for calculation of the compressed error signal to be inputted for model coefficient calculation, or an under-sampled error signal comprising data based on the under-sampled feedback samples may be compressed and inputted for the model coefficient calculation. Alternatively, instead of the compressed error signal, compressed under-sampled feedback samples may be inputted for the model coefficient calculation.

Figure 3:
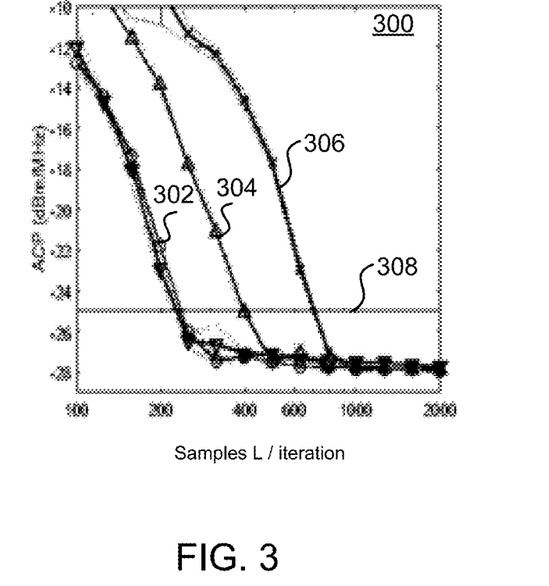
FIG. 3 illustrates an example graph of adjacent channel power based on digital predistortion experiment results and a proposed compression technique according to an example embodiment.
Figure 4:
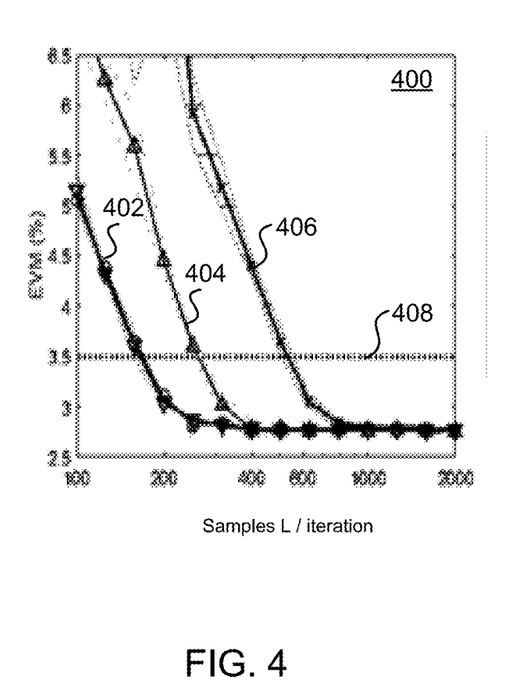
FIG. 4 illustrates an example graph of error vector magnitude based on digital predistortion experiment results and a proposed compression technique according to an example embodiment.

FIGS. 3 and 4 illustrate example graphs of digital pre-distortion experiment results based on a proposed compression technique according to an example embodiment. FIG. 3 illustrates example curves of adjacent channel power (ACP) obtained using different feedback methods. FIG. 4 illustrates example curves of error vector magnitude (EMV) obtained using the different feedback methods. The DPD trial results are obtained by using a OFDM waveform with 256QAM, a bandwidth of 100 MHz and a peak to average power ratio of 7.5 dB. The example measurements were performed with a Doherty PA operating at 3.5 GHz, in a closed-loop adaptive DPD system.

The example curves in FIGS. 3 and 4 show at 306 and 406 normal feedback sampled at a Nyquist rate, at 304 and 404 feedback with under-sampling, and at 302 and 402 feedback with the proposed compression technique, wherein both under-sampling and sample combing is used. In graph 300 in FIG. 3, line 308 indicates an ACP limit. In graph 400 in FIG. 4, line 408 indicates an example target linearity for the EVM for e.g. the 256QAM.

The shown ACP curves 302, 304, 306 and EVM curves 402, 404, 406 are snapshots after 20 closed-loop iterations (starting from a non-identified GMP (generalized memory polynomial) model, i.e., all coefficients are initialized with 0, linear gain is 1). Consequently, the curves 302, 304, 306 in the ACP plot may not display fully converged performances. An additional iteration will allow each of the points to converge further toward −28 dBm. However, the relation between the curves represents the differences in convergence speed of the DPD adaptation algorithm.

Under-sampling has only limited potential to densify the signal/distortion statistics to a small set of samples. Sampling at even decreased rate may not improve the result of the curve 304 or 404 wherein only under-sampling is utilized, as under-sampling can only help to overcome high correlation of adjacent samples. In the presented results of graphs 300 and 400 this is already exploited to the maximum.

However, the proposed integration over several under-sampled feedback samples additionally improves statistical representatives of the condensed sample set by mapping information contained in several samples to a single one which may allow faster closed-loop adaptation.

If samples combined the were without first performing under-sampling, information from the feedback samples would be systematically removed. An integration and dump type filter can be seen as a low-pass type filter combined with a sampling rate down-conversion. Applying a low-pass type filter in a feedback path may thus systematically remove high-frequency information from a signal, which may impair deriving a DPD model valid for full bandwidth since relevant statistical properties of the signal would get removed.

However, under-sampling may cause high-frequency components to be aliased to low-frequency and thus to be mapped to low frequencies. The integration and dump type filter may thus be applied to a DPD system after the under-sampling without systematically removing relevant information. Hence, there is no need, for example, to generate and apply any additional modulation with a pseudo-random sequence to distribute statistical information in the frequency domain before integrating.

While the temporal relation of feedback samples may be lost, the statistical properties may be retained when applying the integration and dump operation despite low-pass characteristics of the integration and dump operation as all necessary information may be randomly aliased to low frequency with the under-sampling, still allowing to identify the model coefficients. Furthermore, information density of a signal may be increased since information from many correlated samples is mapped to a single sample, allowing efficient extraction of model properties.

As can be seen from graphs 300 and 400, with the proposed compression technique indicated by the curves 302 and 402, the lines 308 and 408 are reached at lower sample counts. Further, the curve 302 shows that the proposed compression technique allows fast convergence with significantly less samples. Approximately the same may be achieved with sample selection techniques, wherein a large sample set is first collected and processed, or histograms are precomputed in advance, and then only an optimized sample set with representative statistical properties is selected. Sample combining provides advantages over sample selection techniques which include a lower complexity, ease of application and implementation and robustness against variation of the transmitted signals and PA system conditions (e.g. temperature).

Figure 5:
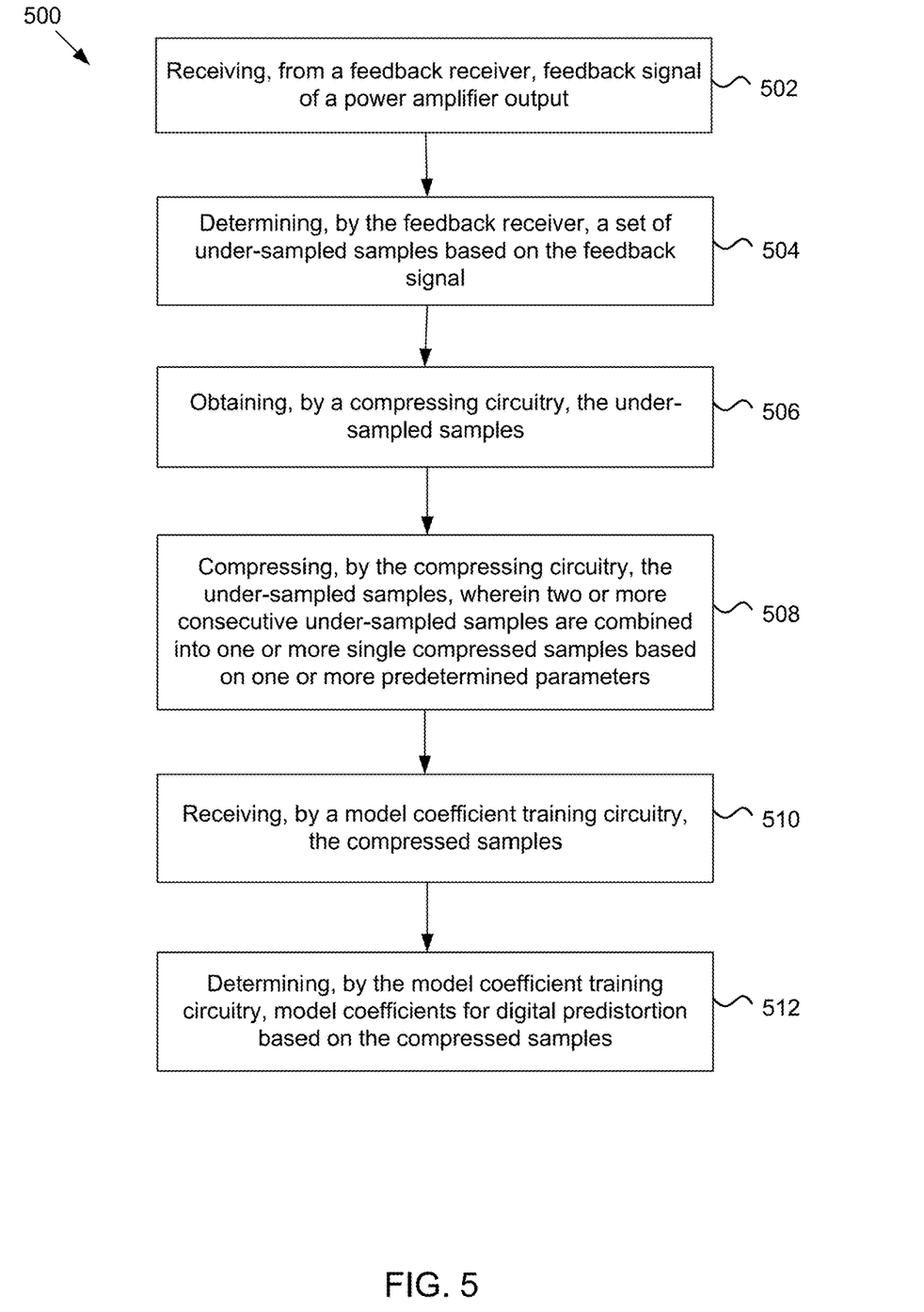
FIG. 5 illustrates an example of a method for feedback compression through sample combining, according to an example embodiment.

FIG. 5 illustrates an example of a method 500 for compressing feedback samples for digital predistortion according to an example embodiment. The method may be performed, for example, by the system 100.

At 502, the method may comprise receiving, from a feedback receiver (116), feedback signal of a power amplifier (112) output.

At 504, the method may comprise determining, by the feedback receiver (116), a set of under-sampled samples based on the feedback signal.

At 506, the method may comprise obtaining, by a compressing circuitry (130), the under-sampled samples.

At 508, the method may comprise compressing, by the compressing circuitry (130), the under-sampled samples, wherein two or more consecutive under-sampled samples are combined into one or more single compressed samples based on one or more predetermined parameters.

At 510, the method may comprise receiving, by a model coefficient training circuitry (102), the compressed samples.

At 512, the method may comprise determining, by the model coefficient training circuitry, model coefficients for digital predistortion based on the compressed samples.

Further features of the methods directly result from the functionalities and parameters of the system 100, as described in the appended claims and throughout the specification and are therefore not repeated here. It is noted that one or more operations of the method may be performed in different order.

The functionality described herein may be performed, at least in part, by one or more computer program product components such as software components. According to an embodiment, the system 100 may comprise a processor or processor circuitry, such as for example a microcontroller, configured by the computer program code when executed to execute at least some embodiments of the operations and functionality described. Alternatively, or in addition, the functionality described herein can be performed, at least in part, by one or more hardware logic components. For example, and without limitation, illustrative types of hardware logic components that can be used include Field-programmable Gate Arrays (FPGAS), application-specific Integrated Circuits (ASICs), application-specific Standard Products (ASSPs), System-on-a-chip systems (SOCs), Complex Programmable Logic Devices (CPLDs), Graphics Processing Units (GPUS).

The system 100 may comprise for example a computing device such as for example a base station, a network node, a server device, a client node, a mobile phone, a tablet computer, a laptop, or the like. In one example, the system 100 may comprise a digital predistortion system, such as a closed-loop digital predistortion system. Functions of the system 100 may be distributed to a plurality of devices.

A system, for example a closed-loop digital predistortion system, may be configured to perform or cause performance of any aspect of the method (s) described herein. Further, a computer program may comprise instructions for causing, when executed, a system to perform any aspect of the method (s) described herein. Further, a system may comprise means for performing any aspect of the method (s) described herein. According to an example embodiment, the means comprises at least one processor, and at least one memory including computer program code, the at least one memory and the computer program code configured to, when executed by the at least one processor, cause performance of any aspect of the method (s).

Any range or device value given herein may be extended or altered without losing the effect sought. Also, any embodiment may be combined with another embodiment unless explicitly disallowed.

Although subjects may be referred to as 'first' or 'second' subjects, this does not necessarily indicate any order or importance of the subjects. Instead, such attributes may be used solely for the purpose of making a difference between subjects.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item may refer to one or more of those items.

The operations of the methods described herein may be carried out in any suitable order, or simultaneously where appropriate. Additionally, individual blocks may be deleted from any of the methods without departing from the scope of the subject matter described herein. Aspects of any of the embodiments described above may be combined with aspects of any of the other embodiments described to form further embodiments without losing the effect sought.

The term 'comprising' is used herein to mean including the method, blocks, or elements identified, but that such blocks or elements do not comprise an exclusive list and a method or apparatus may contain additional s or elements.

As used in this application, the term 'circuitry' may refer to one or more or all of the following: (a) hardware-only circuit implementations (such as implementations in only analog and/or digital circuitry) and (b) combinations of hardware circuits and software, such as (as applicable): (i) a combination of analog and/or digital hardware circuit (s) with software/firmware and (ii) any portions of hardware processor (s) with software (including digital signal processor (s)), software, and memory(ies) that work together to cause a system or an apparatus, such as a mobile phone or server, to perform various functions) and (c) hardware circuit (s) and or processor (s), such as a microprocessor (s) or a portion of a microprocessor (s), that requires software (e.g., firmware) for operation, but the software may not be present when it is not needed for operation. This definition of circuitry applies to all uses of this term in this application, including in any claims.

As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in server, a cellular network device, or other computing or network device.

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from scope of this specification.

The invention claimed is:

1. A system, comprising:
 a feedback receiver configured to receive feedback signal of a power amplifier output and determine a set of under-sampled samples based on the feedback signal;
 a compressing circuitry configured to:
 obtain the under-sampled samples; and
 compress the under-sampled samples, wherein two or more consecutive under-sampled samples are combined into one or more single compressed samples based on one or more predetermined parameters;
 wherein the compressing circuitry comprises an integrate and dump filter configured to combine the two or more consecutive under-sampled samples based on the one of more predetermined parameters; and a model coefficient training circuitry configured to receive the compressed samples and determine model coefficients for digital predistortion based on the compressed samples.

2. The system of claim 1, wherein the system comprises a closed-loop digital predistortion system.

3. The system of claim 1, wherein the feedback receiver comprises one or more analog-to-digital converters configured to perform the under-sampling according to a predetermined under-sampling rate.

4. The system of claim 1, wherein the under-sampled samples comprise under-sampled feedback samples of the feedback signal or an under-sampled error signal indicating differences between a set of the feedback samples and baseband samples of an intended transmit signal.

5. The system of claim 3, wherein the feedback receiver is configured to determine the under-sampled error signal based on an error signal calculated in an analog domain or determine the under-sampled error signal in a digital domain based on the under-sampled feedback samples and under-sampled baseband samples of an intended transmit signal.

6. The system of claim 1, wherein the compressing circuitry or the model coefficient training circuitry is further configured to determine a compressed error signal based on the compressed samples.

7. The system of claim 1, wherein the predetermined parameters comprise at least one of an integration period, an under-sampling rate of the set of under-sampled samples, or a length of the set of under-sampled samples.

8. The system of claim 1, wherein the model coefficient training circuitry is configured to determine a regressor matrix, wherein regressors of the regressor matrix are determined based on baseband samples of an intended transmit signal, and wherein two or more determined consecutive regressors are further combined based on the predetermined parameters to match the compressed samples; and
wherein the model coefficient training circuitry is configured to determine the model coefficients based on the resulting regressor matrix and the compressed samples.

9. The system of claim 1, wherein the compressing circuitry is configured to receive the under-sampled samples at a sampling rate of a first frequency and to output the compressed samples at a sampling rate of a second frequency, wherein the second frequency is lower than the first frequency.

10. The system of claim 7, wherein the compressing circuitry is configured to divide consecutive under-sampled samples into groups according to the integration period and a length of the set of under-sampled samples, and to combine the group of under-sampled samples within the integration period into the single sample.

11. The system of claim 8, further comprising delay circuitries configured to synchronize the baseband samples inputted to at least two of the regressor matrix, the model coefficient training circuitry, the compressing circuitry or the feedback receiver.

12. The system of claim 1, wherein the system comprises at least one of a base station, user equipment or an optical transmitter.

13. The system of claim 1, further comprising a digital predistorter configured to output a predistorted input for the power amplifier-based on the model coefficients received from the model coefficient training circuitry.

14. A method, comprising:
receiving, from a feedback receiver, a feedback signal of a power amplifier output;
determining, by the feedback receiver, a set of under-sampled samples based on the feedback signal;
obtaining, by a compressing circuitry, the under-sampled samples;
compressing, by the compressing circuitry, the under-sampled samples, wherein two or more consecutive under-sampled samples are combined into one or more single compressed samples based on one or more predetermined parameters;
wherein the compressing circuitry comprises an integrate and dump filter configured to combine the two or more consecutive under-sampled samples based on the one or more predetermined parameters;
receiving, by a model coefficient training circuitry, the compressed samples; and
determining, by the model coefficient training circuitry, model coefficients for digital predistortion based on the compressed samples.

* * * * *

UNITED STATES PATENT AND TRADEMARK OFFICE
CERTIFICATE OF CORRECTION

| | | |
|---|---|---|
| PATENT NO. | : 12,088,260 B1 | Page 1 of 1 |
| APPLICATION NO. | : 18/591765 | |
| DATED | : September 10, 2024 | |
| INVENTOR(S) | : Arne Fischer-Buhner | |

It is certified that error appears in the above-identified patent and that said Letters Patent is hereby corrected as shown below:

In the Claims

Claim 1 should read:
1. A system, comprising:
    a feedback receiver configured to receive feedback signal of a power amplifier output and determine a set of under-sampled samples based on the feedback signal;
    a compressing circuitry configured to:
    obtain the under-sampled samples; and
    compress the under-sampled samples, wherein two or more consecutive under-sampled samples are combined into one or more single compressed samples based on one or more predetermined parameters;
    wherein the compressing circuitry comprises an integrate and dump filter configured to combine the two or more consecutive under-sampled samples based on the one or more predetermined parameters; and
    a model coefficient training circuitry configured to receive the compressed samples and determine model coefficients for digital predistortion based on the compressed samples.

Signed and Sealed this
Twenty-second Day of October, 2024

Katherine Kelly Vidal
*Director of the United States Patent and Trademark Office*